United States Patent [19]

Izumi et al.

[11] Patent Number: 5,573,960
[45] Date of Patent: Nov. 12, 1996

[54] METHOD OF MANUFACTURING SEMICONDUCTOR LAYERS BY BONDING WITHOUT DEFECTS CREATED BY BONDING

[75] Inventors: Shigekazu Izumi; Norio Hayafuji, both of Itami, Japan

[73] Assignee: Mitsubishi Denki Kabushiki Kaisha, Tokyo, Japan

[21] Appl. No.: 500,247

[22] Filed: Jul. 10, 1995

[30] Foreign Application Priority Data

Jul. 11, 1994 [JP] Japan ..................... 6-158465

[51] Int. Cl.$^6$ .............................. H01L 21/265
[52] U.S. Cl. .................... 437/21; 437/31; 437/133; 437/228; 437/247; 148/DIG. 12; 148/DIG. 51; 148/DIG. 72; 148/DIG. 150
[58] Field of Search ............... 148/DIG. 12, DIG. 72, 148/DIG. 150, DIG. 51; 437/21, 133, 31, 247, 228

[56] References Cited

U.S. PATENT DOCUMENTS

| | | | |
|---|---|---|---|
| 4,691,779 | 7/1986 | Abernathey et al. | 156/628 |
| 4,771,016 | 9/1988 | Bajor et al. | 437/180 |
| 4,891,329 | 1/1990 | Reisman et al. | 148/DIG. 12 |
| 4,897,362 | 1/1990 | Delgado et al. | 437/26 |
| 5,013,681 | 5/1991 | Godbey et al. | 437/86 |
| 5,060,030 | 10/1991 | Hoke | 357/22 |
| 5,234,535 | 8/1993 | Beyer et al. | 156/630 |
| 5,277,748 | 1/1994 | Sakaguchi et al. | 156/630 |
| 5,310,451 | 5/1994 | Tejwani et al. | 156/630 |
| 5,324,678 | 6/1994 | Kusunoki | 437/51 |
| 5,344,524 | 9/1994 | Shara et al. | 156/630 |
| 5,366,923 | 11/1994 | Beyer et al. | 437/62 |
| 5,366,924 | 11/1994 | Easter et al. | 437/63 |
| 5,374,581 | 12/1994 | Ichikawa et al. | 437/62 |
| 5,433,168 | 7/1995 | Yonehara | 117/90 |
| 5,476,813 | 12/1995 | Naruse | 437/132 |

FOREIGN PATENT DOCUMENTS

| | | |
|---|---|---|
| 1304722 | 12/1989 | Japan . |
| 04240788 | 8/1992 | Japan . |

OTHER PUBLICATIONS

Wada et al., "Electrical Characteristics Of Low Temperature Directly Bonded GaAs/InP Heterojunctions", Inst. Phys. Conf. Ser., No. 129, Chapter 12, 1992, pp. 947–948.

*Primary Examiner*—George Fourson
*Assistant Examiner*—Long Pham
*Attorney, Agent, or Firm*—Leydig, Voit & Mayer

[57] ABSTRACT

A method of manufacturing a semiconductor layer includes preparing a first semiconductor substrate; forming an etching stop layer on the surface of the first substrate; forming an active layer on the etching stop layer; forming a crystal defect reducing layer on the active layer; preparing a second semiconductor substrate having a heat conductivity higher than the heat conductivity of the first substrate; bonding the crystal defect reducing layer to the second substrate; selectively etching the first substrate to expose the etching stop layer; selectively etching the etching stop layer to expose the active layer, whereby the active layer is disposed on the second substrate with the crystal defect reducing layer therebetween. The heat dissipation property is significantly improved by the second substrate having a high heat conductivity and by reducing the thicknesses of the active layer and the crystal defect reducing layer. In addition, good crystallinity of the active layer and sufficient mechanical strength of the substrate are obtained.

14 Claims, 7 Drawing Sheets

Prior Art

Prior Art

METHOD OF MANUFACTURING SEMICONDUCTOR LAYERS BY BONDING WITHOUT DEFECTS CREATED BY BONDING

FIELD OF THE INVENTION

The present invention relates to a method of manufacturing a semiconductor layer having a preferable heat dissipation property and comprising an active layer for a semiconductor device, such as a heterojunction bipolar transistor, a field effect transistor, a laser diode, or an integrated circuit, and a substrate for heat dissipation.

BACKGROUND OF THE INVENTION

GaAs and related compound semiconductor (hereinafter referred to as GaAs series) devices and InP and related compound semiconductor (hereinafter referred to as InP series) devices have been extensively employed as high-frequency elements in heterojunction bipolar transistors and field effect transistors and as optical elements in laser diodes because the mobility of electrons in these compound semiconductor is higher than that in Si and charge carrier transitions in the compounds are direct interband transitions.

However, GaAs (InP) series semiconductor devices have a disadvantage in that the heat conductivity of GaAs (InP) is lower than Si. Basic physical properties of representative semiconductors are shown in table 1. As can be seen from the table 1, the heat conductivities of GaAs and InP are lower than the heat conductivities of GaP and Si.

TABLE 1

| Substance | Heat Conductivity (Resistivity) | Lattice Constant | Crystal Structure | Thermal Expansion Coefficient |
|---|---|---|---|---|
| | Unit | | | |
| Substance | W/cmK (cmK/W) | Å | — | 1/K |
| GaAs | 0.54 (1.852) | 5.6533 | Zincblende | $5.7 \times 10^{-6}$ |
| InP | 0.70 (1.429) | 5.8688 | Zincblende | $4.5 \times 10^{-6}$ |
| GaP | 1.10 (0.909) | 5.4511 | Zincblende | $4.7 \times 10^{-6}$ |
| Si | 1.57 (0.637) | 5.4301 | Diamond | $2.4 \times 10^{-6}$ |

Generally, the heat dissipation property of a device depends on its heat resistance, and the heat resistance of a substance is represented by a rise in temperature (unit: K) per unit heat flow (unit: Joule/sec=Watt). The heat resistance is equal to (heat resistivity)×(length of the substance)/(cross section of the substance). The heat resistivity is the reciprocal of heat conductivity. When a GaAs (InP) series semiconductor device, such as a heterojunction bipolar transistor, a field effect transistor, or a laser diode, is used as a high-power device, it is necessary to flow a high d.c. current flow through the device. However, since the power efficiency of the device is lower than unity, a certain ratio of power applied to the device is consumed as heat. At this time, as the heat resistance of the heat transfer path in the device becomes high, the difference in temperature between both ends of the heat transfer path becomes large, which means that the temperature of the device itself rises, resulting in a degradation of the device characteristics and a reduction of the reliability of the device.

In order to avoid the temperature rise, if the power efficiency is constant, it is necessary to lower the heat resistance by reducing the length of the heat transfer path or by increasing the heat conductivity, i.e., lowering the heat resistivity, of a material in the heat transfer path. More specifically, the following methods are employed.

(1) A GaAs (InP) substrate is thinned, and a plate for absorbing and dissipating heat made of a metal or the like having a high heat conductivity is disposed on the rear surface of the substrate. This plate is called a plated heat sink (referring to PHS hereinafter).

(2) A substrate comprising a crystalline material having a high heat conductivity, such as GaP or Si, is employed, and GaAs series (InP series) crystalline layers for producing elements are grown on the substrate.

Basically, method (1) is for shortening the heat transfer path and method (2) is for increasing the heat conductivity of a material in the heat transfer path.

Figure 7:
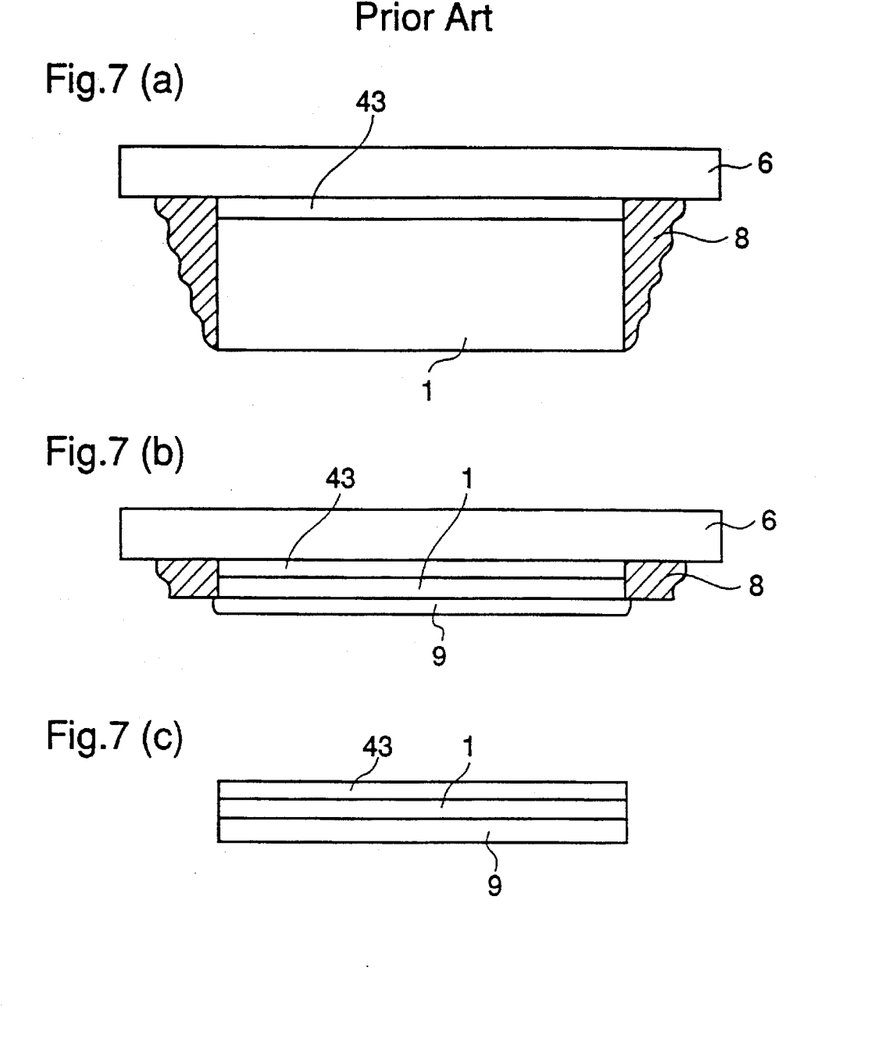
FIGS. 7(a)–7(c) are schematic views for explaining a method of manufacturing a semiconductor layer in which a PHS is formed after grinding a substrate according to the prior art.

An example of method (1) in which a GaAs substrate having a low heat conductivity is thinned by grinding and a metal or the like having a high heat conductivity is plated on the rear surface of the substrate to make a PHS will be described in more detail. A series of steps of this method are shown in FIGS. 7(a)–7(c). First of all, a semiconductor layer 43 about 2 μm thick, which is a constituent of a high-power device, such as a heterojunction bipolar transistor, is grown on a GaAs substrate 1 about 600 μm thick. Although in FIG. 7(a) the semiconductor layer 43 is illustrated as a single layer, it comprises an active layer and a buffer layer. Thereafter, the substrate is attached to a glass plate 6 using wax 8 (FIG. 7(a)). The glass plate 6 is in contact with the semiconductor layer 43. Then, the GaAs substrate 1 is grounded until its thickness becomes about 30 μm or less and a PHS 9 for heat dissipation is plated (FIG. 7(b)). Finally, the GaAs substrate 1 is separated from the glass plate 6 (FIG. 7(c)). According to this method, however, it is difficult to maintain preferable uniformity of the thickness of the ground substrate, and the mechanical strength of the substrate is lowered, whereby the process steps after the grinding step become unstable.

Figure 8:
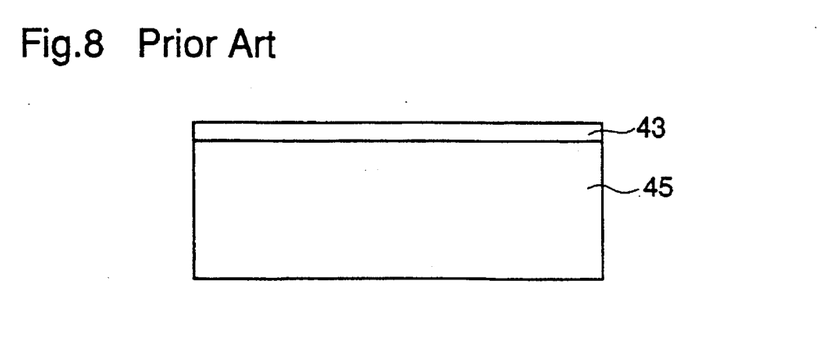
FIG. 8 is a schematic view for explaining a method of manufacturing a semiconductor layer in which an active layer of a semiconductor device is grown on a substrate comprising a crystalline material having a high heat conductivity, according to the prior art.

On the other hand, according to the above-described method (2) in which a semiconductor layer 43, which is a constituent of a high-power device, is grown on a substrate 45 comprising a crystalline material having a high heat conductivity, such as GaP or Si, since the lattice constant, the thermal expansion coefficient, and the crystal structure of the semiconductor layer 43 are different from those of the substrate 45, it is difficult to obtain a semiconductor layer 43 with preferable crystallinity. In fact, as shown in the table 1, the lattice constants, the thermal expansion coefficients, and the crystal structures of GaAs and InP are different from those of GaP and Si.

Figure 9:
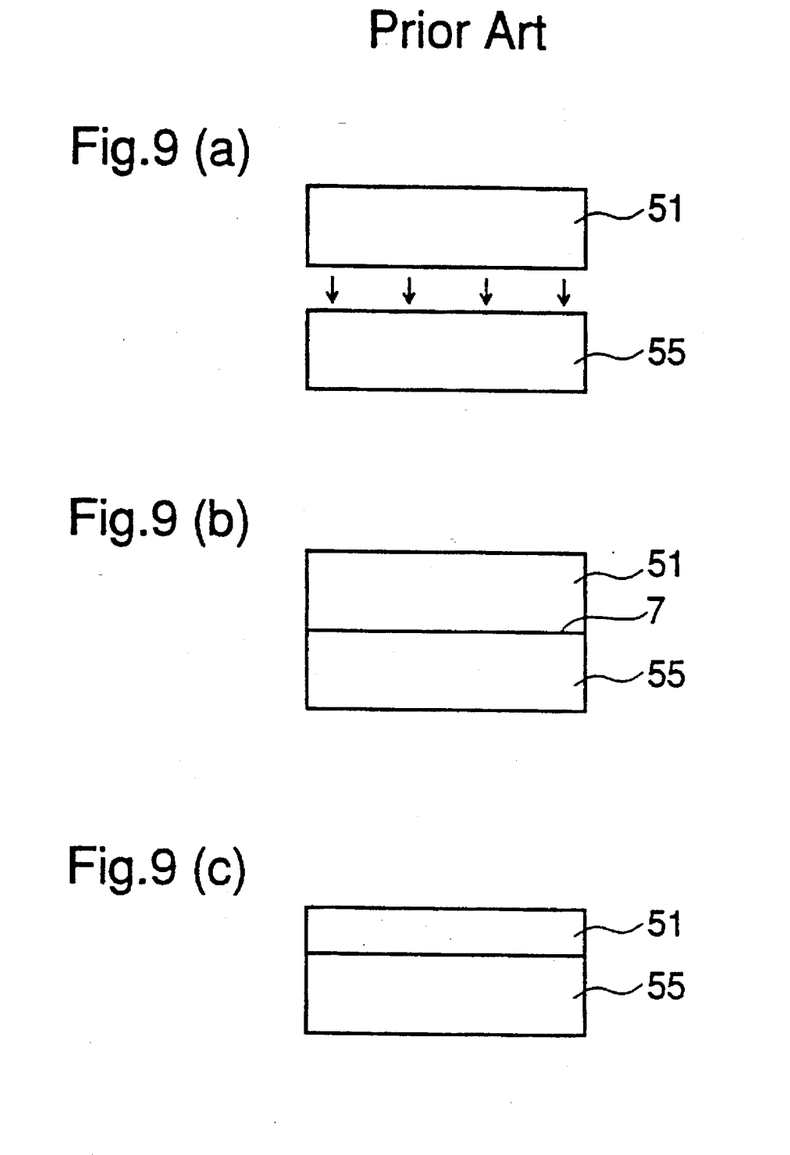
FIGS. 9(a)–9(c) are schematic views for explaining a method of manufacturing a semiconductor layer using direct bonding of a substrate according to the prior art.

Besides the above-described methods (1) and (2), a method disclosed in Japanese Published Patent Application No. Hei. 1-304722 is known. A series of process steps of this method are shown in FIGS. 9(a)–9(c). In this method, a semiconductor substrate 51 on which a device is later fabricated is directly bonded to a substrate 55 comprising a material having a high heat conductivity (FIGS. 9(a)–9(b)) and, thereafter, the semiconductor substrate 51 is ground or etched to a predetermined thickness (FIG. 9(c)), followed by fabrication of the device. According to this method, degradation of crystallinity of semiconductor layers grown on the semiconductor substrate 51 is prevented. However, after the direct bonding of the semiconductor substrate 51 to the substrate 55, it is difficult to maintain the uniformity of the thickness of the semiconductor substrate 51 when it is ground or etched. Likewise, there is a problem in reproducibility. In addition, it is impossible to make the semiconductor substrate 51 thinner than the deviation of the thickness of the substrate 51. The thinner the substrate is, the better the heat dissipation property is. However, in the above respect, there is a limit in improvement of the heat dissipation property in this method.

In order to improve the heat dissipation property of the high-power GaAs (InP) series semiconductor device and suppress unwanted rise in the temperature of the device, there have been the above-described methods, that is, method (1) in which a GaAs (InP) substrate 1 is thinned and a PHS 9 having a high heat conductivity is disposed on the rear surface of the substrate 1, and method (2) in which a substrate 45 comprising a crystalline material having a high heat conductivity is prepared and a GaAs (InP) series crystalline layer 43 which is a constituent of a device is grown on the substrate 45. However, according to method (1), it is difficult to grind the GaAs substrate 1 while maintaining uniformity of the thickness, and a sufficient mechanical strength of the wafer cannot be obtained after the grinding, so that the subsequent steps are not stably performed. According to the method (2), since lattice constant, the thermal expansion coefficient, and the crystal structure of the material of the substrate 45 are different from those of the semiconductor layer 43, the crystallinity of the semiconductor layer 43 is poor. On the other hand, according to the method in which a semiconductor substrate 51 on which semiconductor layers as constituents of a device are later produced is directly bonded to a substrate 55 having a high heat conductivity, although degradation of the crystallinity of the semiconductor layers is avoided, it is difficult to maintain uniformity and reproducibility of the thickness of the semicondutor substrate 51 when the substrate 51 is ground or etched after the bonding. In addition, it is impossible to make the semiconductor substrate 51 thinner than the deviation of the thickness. Accordingly, there is a limit in the improvement of the heat dissipation property.

SUMMARY OF THE INVENTION

It is an object of the present invention to provide a method of manufacturing a semiconductor layer that improves the heat dissipation property of a device in the above-described method of directly bonding a semiconductor substrate on which a device is later fabricated to a substrate comprising a material having a high heat conductivity.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of manufacturing a semiconductor layer comprises preparing a first substrate having a front surface and comprising a semiconductor having a heat conductivity; forming an etching stop layer on the surface of the first substrate; forming an active layer as a constituent of a semiconductor device on the etching stop layer; forming a crystal defect reducing layer on the active layer; preparing a second substrate having a surface and comprising a material having a heat conductivity higher than the heat conductivity of the semiconductor of the first substrate; bonding the crystal defect reducing layer to the surface of the second substrate; selectively etching away the first substrate to expose the etching stop layer; selectively etching away the etching stop layer to expose the active layer, thereby completing a semiconductor layer in which the active layer is disposed on the surface of the second substrate through the crystal defect reducing layer. Therefore, the heat dissipation property is improved by the second substrate comprising a material having a high heat conductivity. In addition, since the crystal defect reducing layer is interposed between the active layer and the second substrate, the crystallinity of the active layer is not degraded. Further, since the second substrate provides sufficient mechanical strength, the process steps after the step of exposing the active layer are stably carried out. In the selective etching of the semiconductor substrate, the etching is automatically stopped when the surface of the etching stop layer is exposed. Likewise, in the selective etching of the etching stop layer, the etching is automatically stopped when the surface of the active layer is exposed. Therefore, the active layer is not adversely affected by the above-described etching steps, i.e., the thickness of the active layer when it was grown is maintained. As a result, the thickness of the active layer is superior in uniformity and reproducibility to the thickness of the semiconductor layer after the etching in the prior art method employing the direct bonding of the substrate. This means that the variation in the thickness of the active layer is suppressed, so that the thicknesses of the active layer and the crystal defect reducing layer can be reduced as compared to the above-described prior art method, thereby further improving the heat dissipation property. Since the heat dissipation property is improved, unwanted rise in the temperature during the high-power output operation of the device is suppressed, and degradation of device characteristics is suppressed, resulting in an increase in reliability. Furthermore, since the uniformity and the reproducibility of the thickness of the active layer are satisfactory, the uniformity and the reproducibility of the device characteristics are improved.

According to a second aspect of the present invention, in the above-described method, the first substrate comprises GaAs. Therefore, when a material having a heat conductivity higher than that of GaAs is employed for the second substrate, the heat resistance of the heat transfer path is reduced, whereby the heat dissipation property is improved.

According to a third aspect of the present invention, in the above-described method, the first substrate comprises GaAs, and the second substrate comprises GaP having a heat conductivity twice as high as that of GaAs. Therefore, the heat resistance of the heat transfer path is reduced, whereby the heat dissipation property is improved.

According to a fourth aspect of the present invention, in the above-described method, the first substrate comprises GaAs and the second substrate comprises Si having a heat conductivity three times as high as that of GaAs. Therefore, the heat conductivity of the heat transfer path is increased, whereby the heat dissipation property is improved. In addition, since not a compound semiconductor but Si is used for the second substrate, the cost is reduced.

According to a fifth aspect of the present invention, in the above-described method, the first substrate comprises GaAs and the second substrate comprises an Si substrate and an $SiO_2$ film much thinner than the Si substrate and disposed on the surface of the Si substrate. The crystal defect reducing layer is bonded to the $SiO_2$ film. Since the Si substrate is employed, the heat resistance of the heat transfer path is reduced, whereby the heat dissipation property is improved. In addition, the $SiO_2$ film insulates the active layer from the Si substrate. Although the heat conductivity of $SiO_2$ is several tenths that of Si, since the thickness of the $SiO_2$ film is much thinner than the thickness of the Si substrate, the heat resistance of the $SiO_2$ film is very low and negligible compared to the heat resistance of the Si substrate. Furthermore, since not a compound semiconductor but Si is used for the second substrate, the cost is reduced.

According to a sixth aspect of the present invention, in the above-described method, the first substrate comprises InP. Therefore, when a material having a heat conductivity higher than that of InP is employed for the second substrate, the heat resistance of the heat transfer path is reduced, whereby the heat dissipation property is improved.

According to a seventh aspect of the present invention, in the above-described method, the first substrate comprises InP, and the second substrate comprises Si having a heat conductivity twice as high as that of InP. Therefore, the heat conductivity of the heat transfer path is increased, whereby the heat dissipation property is improved. In addition, since not a compound semiconductor but Si is used for the second substrate, the cost is reduced.

According to an eighth aspect of the present invention, in the above-described method, the first substrate comprises InP and the second substrate comprises an Si substrate and an $SiO_2$ film much thinner than the Si substrate and disposed on the surface of the Si substrate. The crystal defect reducing layer is bonded to the $SiO_2$ film. Since the Si substrate is employed, the heat resistance of the heat transfer path is reduced, whereby the heat dissipation property is improved. In addition, the $SiO_2$ film insulates the active layer from the Si substrate. Although the heat conductivity of $SiO_2$ is several tenths that of Si, since the thickness of the $SiO_2$ film is much thinner than the thickness of the Si substrate, the heat resistance of the $SiO_2$ film is very low and negligible compared to the heat resistance of the Si substrate. Furthermore, since not a compound semiconductor but Si is used for the second substrate, the cost is reduced.

According to a ninth aspect of the present invention, in the above-described method, the active layer produced on the etching stop layer is an active layer for a heterojunction bipolar transistor. Also in this case, since the thicknesses of the active layer and the crystal defect reducing layer can be reduced, the heat dissipation property is improved. Therefore, in a heterojunction bipolar transistor having a high current density, unwanted rise in the temperature during the high-power output operation is suppressed, and degradation in the device characteristics is suppressed, resulting in an increase in reliability. Further, since the uniformity and the reproducibility of the thickness of the active layer are satisfactory, the uniformity and the reproducibility of the device characteristics are improved. Furthermore, since the second substrate has sufficient mechanical strength, process steps after the step of exposing the surface of the active layer are stably carried out.

DESCRIPTION OF THE PREFERRED EMBODIMENTS

Embodiment 1

FIGS. 1(a)–1(d) are schematic views illustrating process steps in a method of manufacturing a semiconductor layer in accordance with a first embodiment of the present invention. In these figures, reference numeral 1 designates a GaAs substrate (first substrate), numeral 2 designates an etching stop layer, numeral 3 designates a GaAs series active layer for a semiconductor device, numeral 4 designates a crystalline defect reducing layer, numeral 5 designates a GaP substrate (second substrate), numeral 6 designates a glass plate, numeral 7 designates a bonded interface, and numeral 8 designates wax. Although the GaAs series active layer 3 is illustrated as a single layer, actually it comprises a plurality of GaAs series semiconductor layers.

A description is given of the manufacturing method.

Figure 1:
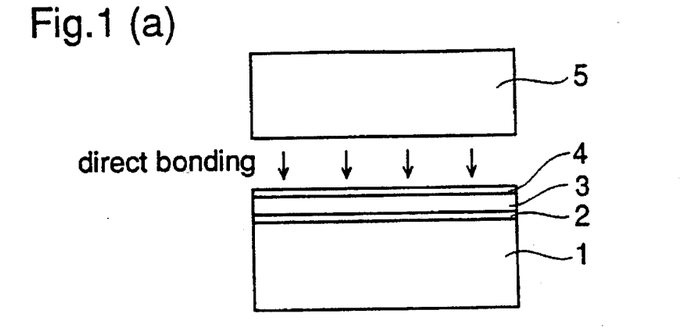
FIGS. 1(a)–1(d) are schematic views for explaining a method of manufacturing a semiconductor layer according to a first embodiment of the present invention.

Initially, as illustrated in FIG. 1(a), the etching stop layer 2 comprising $In_{0.49}Ga_{0.51}P$ and having a thickness of about 100 nm is epitaxially grown on the GaAs substrate 1 (first substrate). $In_{0.49}Ga_{0.51}P$ is lattice-matched with GaAs. Then, the GaAs series active layer 3 is epitaxially grown from a layer to be positioned farthest from the second substrate 5 when the semiconductor layer is completed. Finally, the crystal defect reducing layer 4 comprising GaAs is grown on the active layer 3. Then, the second substrate 5 comprising GaP that has a heat conductivity twice as high as the heat conductivity of GaAs is directly bonded to the surface of the crystal defect reducing layer 4. A sufficient bonding strength is obtained by annealing at 450° C. in hydrogen for 30 min. (H. Wada et al., International Symposium of Gallium Arsenide and Related Compounds, 1992). Since damage caused by the direct bonding is all absorbed by the crystal defect reducing layer 4 on the active layer 3, the active layer 3 is not degraded in quality.

In the step of FIG. 1(b), the GaP substrate 5 is adhered to the glass plate 6 using wax 8 or the like. Thereafter, as shown in FIG. 1(c), the GaAs substrate 1 is subjected to chemical wet-etching at the exposed surface opposite side of the glass plate 6. When a mixture of $H_2SO_4$: $H_2O_2$: $H_2O$ (=5:1:1) heated to 25° C. is used as an etchant, the etching is automatically stopped at the $In_{0.49}Ga_{0.51}P$ etching stop layer 2. The etching rate by this etchant is approximately 5

μm/min. That is, this etchant does not etch $In_{0.49}Ga_{0.51}P$ but etches GaAs. Thus, the GaAs substrate is removed with high uniformity and repeatability. Thereafter, the $In_{0.49}Ga_{0.51}P$ layer 2 is removed by wet-etching using a mixture of HCl (30%): $H_2O$ (=3:2) heated to 25° C. as an etchant. The etching rate is approximately 150 nm/min. Since this etchant does not etch GaAs but etches $In_{0.49}Ga_{0.51}P$, when the surface of the GaAs series compound semiconductor active layer 3 is exposed, the etching is automatically stopped. Like the above-described etching of the GaAs substrate 1, the $In_{0.49}Ga_{0.51}P$ layer 2 is removed with high uniformity and repeatability.

Finally, the GaP substrate 5 is separated from the glass plate 6 to complete the manufacturing process. As a result, a structure shown in FIG. 1(d) in which the active layer 3 is disposed on the GaP substrate 5 through the crystal defect reducing layer 4 is obtained.

A description is given of function and effect of the above-described manufacturing method.

In this first embodiment of the invention, since the second substrate 5 comprises GaP having a heat conductivity approximately twice as high as that of GaAs, heat dissipation is improved as compared to the case where a GaAs substrate is used. Furthermore, since the selective etching is employed as described above, the uniformity of the thickness of the active layer when it is grown is almost maintained, and there is little variation in the thickness of the active layer 3 and the thickness of the crystal defect reducing layer 4 due to the etching. Therefore, the active layer 3 can be thinned to a minimum thickness that is necessary to fabricate a device and the crystal defect reducing layer 4 can be thinned to a minimum thickness that is necessary to prevent the active layer from being damaged due to direct bonding. According to the prior method including direct bonding of the substrate, since the etching stop layer is not used, after the etching, the variation in the thickness of the semiconductor substrate on which a device is fabricated is considerable and, consequently, the above-described reduction in the thickness of the active layer and the crystal defect reducing layer to the minimum is impossible.

According to the first embodiment of the present invention, heat dissipation is significantly improved, and degradation of device characteristics caused by temperature rise during the operation of the device is prevented, whereby reliability is improved. Furthermore, uniformity and reproducibility of the device characteristics are improved. Further, crystallinity of the active layer is satisfactory as described above. In addition, since the semiconductor layers as constituents of a device, i.e., the crystal defect reducing layer 4 and the active layer 3, are adhered to the GaP substrate 5 having a thickness exceeding 100 μm that is sufficient to maintain mechanical strength, subsequent process steps for completing the device are stably carried out.

Embodiment 2

Figure 2:
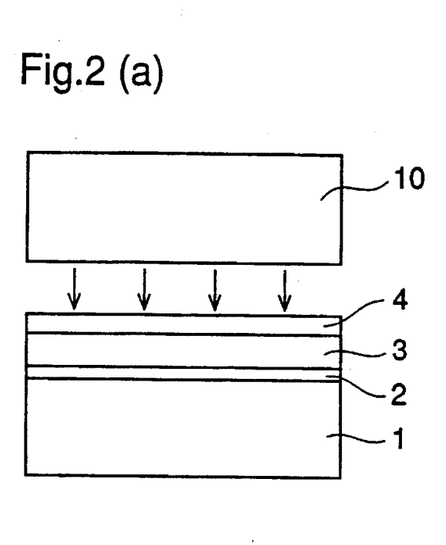
FIGS. 2(a)–2(b) are schematic views for explaining a method of manufacturing a semiconductor layer according to a second embodiment of the present invention.

FIGS. 2(a)–2(b) are schematic views for explaining a method of manufacturing a semiconductor layer according to a second embodiment of the present invention.

The process Step according to this second embodiment are fundamentally identical to those already described with respect to FIGS. 1(a)–1(d) except that Si is used instead of GaP. More specifically, in the step of FIG. 2(a), the $In_{0.49}Ga_{0.51}P$ etching stop layer 2, the active layer 3, and the crystal defect reducing layer 4 comprising GaAs are successively grown on the GaAs substrate 1. Then, a second substrate 10 comprising Si having a heat conductivity approximately three times as high as that of GaAs is directly bonded to the surface of the crystal defect reducing layer 4.

A sufficient bonding strength is obtained by annealing at 450° C. in hydrogen for 30 min. Since damage caused by the direct bonding is all absorbed by the crystal defect reducing layer 4 on the active layer, the quality of the active layer is not degraded. Thereafter, as shown in FIGS. 1(b) and 1(c), the Si substrate 10 is adhered to the glass plate 6 using wax 8 or the like, and the GaAs substrate 1 and the etching stop layer 2 are successively removed by selective etching. Finally, the Si substrate 10 is separated from the glass plate 6 to complete the manufacturing process. As a result, the structure shown in FIG. 2(b) in which the active layer 3 is disposed on the Si substrate 10 through the crystal defect reducing layer 4 is obtained.

A description is given of function and effect of the manufacturing method according to the second embodiment.

Since the heat conductivity of Si is three times as high as that of GaAs and higher than that of GaP, the heat dissipation property is further improved as compared to the above-described first embodiment where the GaP substrate is used. In addition, the cost is reduced as compared to the case where a compound semiconductor substrate is used. As in the above-described first embodiment, the crystallinity of the active layer 3 is improved, uniformity and reproducibility of the device characteristics are improved, and sufficient mechanical strength of the substrate is maintained.

Embodiment 3

Figure 3:
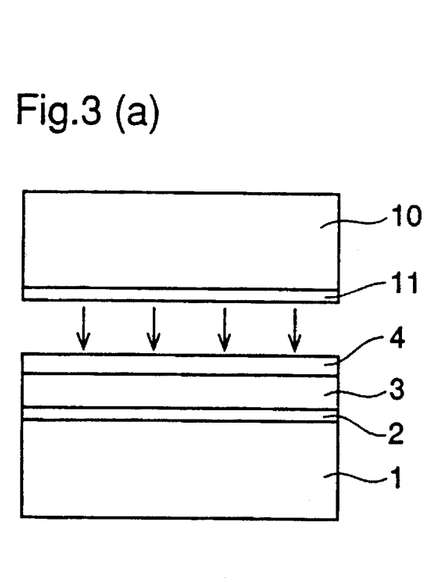
FIGS. 3(a)–3(b) are schematic views for explaining a method of manufacturing a semiconductor layer according to a third embodiment of the present invention.

FIGS. 3(a)–3(b) are schematic views for explaining a method of manufacturing a semiconductor layer according to a third embodiment of the present invention.

Initially, as illustrated in FIG. 3(a), a thin $SiO_2$ film 11 having a thickness of 200–500 nm is formed on an Si substrate 10 preferably by CVD (Chemical Vapor Deposition). Alternatively, the thin $SiO_2$ film 11 may be formed by oxidizing the surface of the Si substrate 10. Thereafter, the etching stop layer 2, the active layer 3, and the crystal defect reducing layer 4 are successively produced on the GaAs substrate 1 as in the above-described first embodiment of the invention. Then, the $SiO_2$ thin film 11 is directly bonded to the crystal defect reducing layer 4. The direct bonding is carried out under the same conditions as described in the first embodiment. The subsequent process steps are identical to those already described with respect to FIGS. 1(b), 1(c), and 1(d) according to the first embodiment. That is, the Si substrate 10 is attached to the glass plate 6 using wax 8 or the like, and the GaAs substrate 1 and the etching stop layer 2 are successively removed by selective etching, followed by separation of the Si substrate 10 from the glass plate 6. As a result, a structure shown in FIG. 3(b) in which the active layer 3 is disposed on the Si substrate 10 through the thin $SiO_2$ film 11 and the crystal defect reducing layer 4 is obtained.

A description is given of function and effect of the manufacturing method according to the third embodiment.

Although the Si substrate 10 has n type conductivity or p type, since the $SiO_2$ film 11 functions as an insulating film when it is thicker than 50 nm, so the Si substrate 10 is insulated from the active layer. On the other hand, although the heat conductivity of $SiO_2$ is several tenths that of Si, since the thickness of the $SiO_2$ film 11 is several hundreds of nanometers, which is much thinner than the thickness of the Si substrate 10, i.e., 100 μm or more, the heat resistance of the thin $SiO_2$ film 11 is very low and negligible compared to the heat resistance of the Si substrate 10. As a result, by using the $SiO_2$ thin film 11, the Si substrate 10 is insulated from the GaAs series compound semiconductor device and the heat dissipation property is improved. In addition, as in the above-described first embodiment, the crystallinity of the active layer is satisfactory, uniformity and repeatability of the device characteristics are improved, and sufficient mechanical strength of the substrate is maintained. In addition, since the Si substrate is used for heat dissipation, the cost is reduced as compared to the case where a compound semiconductor substrate is used.

Embodiment 4

FIGS. 4(a)–4(d) are schematic views for explaining a method of manufacturing a semiconductor layer according to a fourth embodiment of the present invention.

Figure 4:
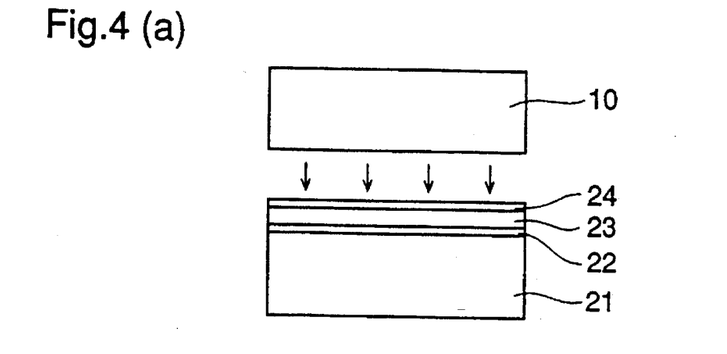
FIGS. 4(a)–4(d) are schematic views for explaining a method of manufacturing a semiconductor layer according to a fourth embodiment of the present invention.

Initially, as illustrated in FIG. 4(a), an etching stop layer 22 comprising $In_{0.53}Ga_{0.47}As$ and having a thickness of 100 nm or less is epitaxially grown on an InP substrate 21 as a first substrate. $In_{0.53}Ga_{0.47}As$ is lattice-matched with InP. Then, InP series compound semiconductor active layers are successively epitaxially grown on the etching stop layer 22 from a layer to be positioned farthest from a second substrate which is later described when the structure is completed. In the figure, these active layers are illustrated as a single layer 23 for simplification. Finally, an InP layer 24 for reducing crystal defects is grown on the active layer 23. Then, a second substrate 10 comprising Si having a heat conductivity twice as high as that of InP is directly bonded to the surface of the crystal defect reducing layer 24. A sufficient bonding strength is obtained by annealing at 450° C. in hydrogen for 30 min. Since damage caused by the direct bonding is all absorbed by the crystal defect reducing layer 24 on the active layer 23, the quality of the active layer is not degraded.

In the step of FIG. 4(b), the Si substrate 10 is adhered to the glass plate 6 using wax 8 or the like. Thereafter, as shown in FIG. 4(c), the InP substrate 21 is subjected to chemical wet-etching at the exposed surface on the opposite side of the glass plate 6. When diluted hydrochloric acid heated to 25° C. is used as an etchant, the etching is automatically stopped at the $In_{0.53}Ga_{0.47}As$ etching stop layer 22. The etching rate of InP by this etchant is approximately 5 µm/min. That is, this etchant does not etch $In_{0.53}Ga_{0.47}As$ but etches InP. Thus, the InP substrate is removed with high uniformity and repeatability. Thereafter, the $In_{0.53}Ga_{0.47}As$ layer 22 is removed by wet-etching using a mixture of citric acid (50%) and $H_2O_2$ (30%) (=4:1) heated to 25° C. as an etchant. The etching rate of $In_{0.53}Ga_{0.47}As$ by this etchant is approximately 150 nm/min. Since this etchant does not etch InP but etches $In_{0.53}Ga_{0.47}As$, when the surface of the InP series compound semiconductor active layer 23 is exposed, the etching is automatically stopped. Like the above-described etching of the InP substrate 21, the $In_{0.53}Ga_{0.47}As$ layer 22 is removed with high uniformity and repeatability. Finally, the Si substrate 10 is separated from the glass plate 6 to complete the manufacturing process.

A description is given of function and effect of the above-described manufacturing method.

In this fourth embodiment of the invention, since the second substrate 10 comprises Si having a heat conductivity approximately twice as high as that of InP, heat dissipation is improved as compared to the case where an InP substrate is used. Furthermore, since the selective etching is employed as described above, the uniformity of the thickness of the active layer 23 when it is grown is almost maintained, and there is little variation in the thickness of the active layer 23 and the thickness of the crystal defect reducing layer 24 due to the etching. Therefore, the active layer 23 can be thinned to a minimum thickness that is necessary to fabricate a device and the crystal defect reducing layer 24 can be thinned to a minimum thickness that is necessary to prevent the active layer 23 from being damaged due to direct bonding. As a result, the heat dissipation property is significantly improved, and the degradation of device characteristics caused by temperature rise during the operation of the device is prevented, whereby the reliability is improved. Furthermore, uniformity and reproducibility of the device characteristics are improved. Further, crystallinity of the active layer is satisfactory as described above. In addition, since the semiconductor layers as constituents of the device, i.e., the crystal defect reducing layer 24 and the active layer 23, are adhered to the Si substrate 10 having a thickness exceeding 100 µm that is sufficient to maintain the mechanical strength, subsequent process steps for completing the device are stably carried out. Since an Si substrate is used as the substrate for heat dissipation, the cost is reduced as compared to the case where a compound semiconductor substrate is used.

Embodiment 5

Figure 5:
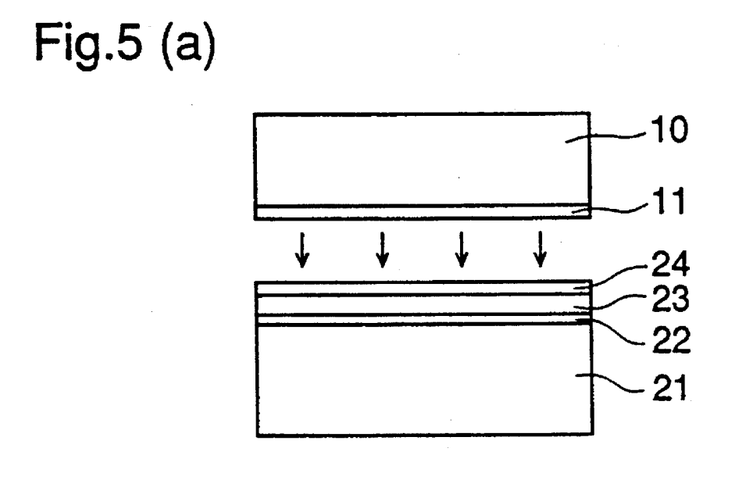
FIGS. 5(a)–5(b) are schematic views for explaining a method of manufacturing a semiconductor layer according to a fifth embodiment of the present invention.

FIGS. 5(a)–5(b) are schematic views for explaining a method of manufacturing a semiconductor layer according to a fifth embodiment of the present invention.

Initially, as illustrated in FIG. 5(a), a thin $SiO_2$ film 11 having a thickness of 200~500 nm is formed on an Si substrate 10 preferably by CVD. Alternatively, the thin $SiO_2$ film 11 may be formed by oxidizing the surface of the Si substrate 10. Thereafter, the etching stop layer 22, the active layer 23, and the crystal defect reducing layer 24 are successively produced on the InP substrate 21 as in the above-described fourth embodiment of the invention. Then, the $SiO_2$ thin film 11 is directly bonded to the crystal defect reducing layer 24. The direct bonding is carried out under the same conditions as described in the fourth embodiment. The subsequent process steps are identical to those already described with respect to FIGS. 4(b), 4(c), and 4(d) according to the fourth embodiment. That is, the Si substrate 10 is attached to the glass plate 6 using wax 8 or the like, and the InP substrate 21 and the etching stop layer 22 are successively removed by selective etching, followed by separation of the Si substrate 10 from the glass plate 6. As a result, the structure shown in FIG. 5(b) in which the active layer 23 is disposed on the Si substrate 10 through the thin $SiO_2$ film 11 and the crystal defect reducing layer 24 is obtained.

A description is given of function and effect of the manufacturing method according to the third embodiment.

Although the Si substrate 10 has a conductivity of n type or p type, since the $SiO_2$ film 11 sufficiently functions as an insulating film when it is thicker than 50 nm, the Si substrate 10 is insulated from the active layer. On the other hand, although the heat conductivity of $SiO_2$ is several tenths that of Si, since the thickness of the $SiO_2$ film 11 is several hundreds of nanometers which is much thinner than the thickness of the Si substrate 10, i.e., 100 µm or more, the heat resistance of the thin $SiO_2$ film 11 is very low and negligible compared to the heat resistance of the Si substrate 10. As a result, by using the $SiO_2$ thin film 11, the Si substrate 10 is insulated from the InP series compound semiconductor device and the heat dissipation property is improved. In addition, as in the above-described fourth embodiment, the crystallinity of the active layer is satisfactory, uniformity and repeatability of the device characteristics are improved, and sufficient mechanical strength of the substrate is maintained. In addition, since the Si substrate is used for heat dissipation, the cost is reduced as compared to the case where a compound semiconductor substrate is used.

Embodiment 6

FIGS. 6(a)–6(f) are schematic views illustrating process steps in a method of manufacturing a heterojunction bipolar transistor (hereinafter referred to as HBT) in accordance with a sixth embodiment of the present invention.

Figure 6:
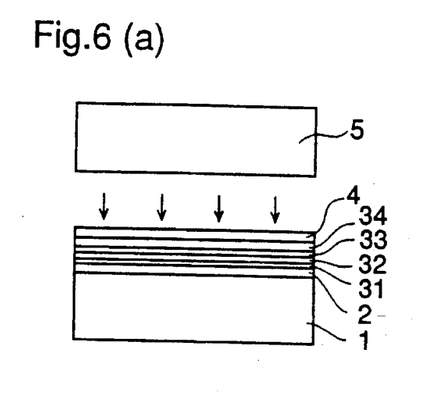
FIGS. 6(a)–6(f) are schematic views for explaining a method of manufacturing a semiconductor layer according to a sixth embodiment of the present invention.

Initially, an $In_{0.49}Ga_{0.51}P$ etching stop layer 2 is grown on a GaAs substrate 1. Thereafter, active layers as constituents of an HBT are successively grown on the etching stop layer 2. The active layers correspond to the GaAs series compound semiconductor active layer 3 shown in FIGS. 1(a)–1(d) according to the first embodiment. More specifically, in this sixth embodiment, an n type InGaAs emitter contact layer 31, an n type AlGaAs emitter layer 32, a p type GaAs base layer 33, and an n type GaAs collector layer 34 are successively grown on the etching stop layer 2. The growing order of these four layers is opposite to the normal growing order because, in the later step, a GaP substrate is bonded to the collector layer 34 side and the GaAs substrate 1 on the emitter contact layer 31 side is removed, whereby the position of the substrate is reversed. The direct bonding of the surface of the crystal defect reducing layer 4 to the GaP substrate 5, the bonding of the GaP substrate 5 to the glass plate 6, the selective etching of the GaAs substrate 1, and the selective etching of the etching stop layer 2 are the same as those described in the first embodiment of the present invention. Then, the GaP substrate 5 is separated from the glass plate 6, whereby a laminated structure in which the emitter contact layer 31 is an uppermost layer is obtained as shown in FIG. 6(b). Therefore, in the following process steps, using a normal method of manufacturing a heterojunction bipolar transistor, the above-described active layers are patterned and electrodes are produced with high stability.

More specifically, as shown in FIG. 6(c), an insulating region 101 is formed by implanting $H^+$ ions and, thereafter, an insulating film is etched using a WSi mask 103, forming a dummy emitter 102. Then, as shown in FIG. 6(d), the emitter contact layer 31 is etched using the dummy emitter 102 as a mask, and the emitter layer 32 is etched using a resist film 104 and the dummy emitter 102 as masks, followed by deposition of base electrodes 105. Thereafter, as shown in FIG. 6(e), the dummy emitter 102 is removed and an emitter electrode 106 is produced. Finally, as shown in FIG. 6(f), portions of the insulating region 101 outside the base electrodes 105 are etched until the collector layer 34 is exposed, and collector electrodes 107 are produced contacting the exposed surface of the collector layer 34, completing a heterojunction bipolar transistor.

A description is given of function and effect of the method of manufacturing a heterojunction bipolar transistor according to the sixth embodiment. Since the GaAs substrate and the etching stop layer are removed by selective etching, it is possible to reduce the thicknesses of the active layers and the crystal defect reducing layer as in the above-described first embodiment. Since the heterojunction bipolar transistor has a relatively high current density as compared to other devices, the improvement of the heat dissipation property by employing the GaP substrate having a heat conductivity twice as high as that of GaAs and by reducing the thicknesses of the active layers and the crystal defect reducing layer is effective in suppressing unwanted rise in the device temperature. In addition, since the crystal defect reducing layer 4 is introduced, the crystallinity of the active layers is improved. Further, high uniformity and reproducibility of the device and a high mechanical strength of the substrate are maintained.

What is claimed is:

1. A method of manufacturing a semiconductor layer structure comprising:
    preparing a first substrate having a surface and comprising a crystalline semiconductor having a heat conductivity;
    forming an etch stopping layer on the surface of the first substrate;
    forming an active layer as a constituent of a semiconductor device on the etch stopping layer;
    forming a crystalline semiconductor defect reducing layer on the active layer;
    preparing a second substrate having a surface and comprising a material having a heat conductivity higher than the heat conductivity of the first substrate;
    bonding the defect reducing layer to the surface of the second substrate at an elevated temperature, the defect reducing layer preventing crystalline defects caused by the bonding from extending to the active layer;
    selectively etching the first substrate to expose the etch stopping layer; and
    selectively etching the etch stopping layer to expose the active layer, whereby the active layer is supported by the second substrate with the defect reducing layer therebetween so that crystalline defects caused by the bonding are confined to the defect reducing layer and do not extend to the active layer.

2. The method of claim 1 wherein the first substrate comprises GaAs.

3. The method of claim 2 wherein the second substrate comprises GaP.

4. The method of claim 2 wherein the second substrate comprises Si.

5. The method of claim 2 including:
    preparing an Si substrate and an $SiO_2$ film much thinner than the Si substrate and disposed on the surface of the Si substrate as the second substrate; and
    bonding the crystal defect reducing layer to the $SiO_2$ film.

6. The method of claim 1 wherein the first substrate comprises InP.

7. The method of claim 6 wherein the second substrate comprises Si.

8. The method of claim 6 including:
    preparing an Si substrate and an $SiO_2$ film much thinner than the Si substrate and disposed on the surface of the Si substrate as the second substrate; and
    bonding the crystal defect reducing layer to the $SiO_2$ film.

9. The method of claim 1 including producing, as the active layer, a plurality of semiconductor layers for forming emitter, base, and collector layers of a heterojunction bipolar transistor on the etch stopping layer.

10. The method of claim 3 wherein the defect reducing layer is GaAs.

11. The method of claim 4 wherein the defect reducing layer is GaAs.

12. The method of claim 5 wherein the defect reducing layer is GaAs.

13. The method of claim 7 wherein the defect reducing layer is InP.

14. The method of claim 8 wherein the defect reducing layer is InP.

* * * * *